United States Patent [19]

Sugawara

[11] Patent Number: 4,472,646
[45] Date of Patent: Sep. 18, 1984

[54] SEMICONDUCTOR FLIP-FLOP CONSUMING LOW POWER

[75] Inventor: Mitsutoshi Sugawara, Tokyo, Japan

[73] Assignee: Nippon Electric Co., Ltd., Tokyo, Japan

[21] Appl. No.: 339,796

[22] Filed: Jan. 15, 1982

[30] Foreign Application Priority Data

Jan. 16, 1981 [JP] Japan .................................. 56-5500

[51] Int. Cl.$^3$ ........................................... H03K 3/288
[52] U.S. Cl. .................... 307/292; 307/288; 307/299 B
[58] Field of Search ............. 307/291, 292, 299 B, 307/288; 377/119, 120

[56] References Cited

U.S. PATENT DOCUMENTS

| | | | |
|---|---|---|---|
| 3,648,072 | 3/1972 | Harper | 307/291 |
| 3,767,943 | 10/1973 | Steckler | 307/292 |
| 3,821,719 | 6/1974 | Taniguchi et al. | 307/291 |
| 3,849,675 | 11/1974 | Waaben | 307/292 |

Primary Examiner—John Zazworsky
Attorney, Agent, or Firm—Sughrue, Mion, Zinn, Macpeak & Seas

[57] ABSTRACT

This invention provides a flip-flop drawing low current and occupying a small area in a semiconductor integrated circuit. The flip-flop has a first and a second transistor having their emitters grounded via a first and a second diode, respectively. The collector of the first transistor is coupled with the base of the second transistor via a third diode. Likewise, the collector of the second transistor is coupled with the base of the first transistor via a fourth diode. The output is derived from the collector of a third transistor having its base-emitter path connected in parallel with the first or second diode to form a current mirror circuit.

19 Claims, 3 Drawing Figures

SEMICONDUCTOR FLIP-FLOP CONSUMING LOW POWER

BACKGROUND OF THE INVENTION

The present invention relates to a flip-flop formed by semiconductor devices, and more particularly, to a flip-flop adapted to be formed in a semiconductor integrated circuit.

Among flip-flops, a set-reset type flip-flop (R-S flip-flop), a trigger type flip-flop (T flip-flop), a delay type flip-flop (D flip-flop), a J-K flip-flop, etc. are known. In the following, the present invention will be described in connection with T flip-flops as an example. The present invention is also applicable to other types of the flip-flops.

A T flip-flop is a flip-flop whose output is inverted in response to rising or falling of an input signal, and it is frequently used in a frequency-divider, a counter, or the like. It is also often used in an analog integrated circuit such as, for example, a D/A converter, a demodulator for a PAL-system television signal, an FM stereo, and other frequency- or phase-control circuits.

In a known T flip-flop suited for such use, a base of one of two transistors whose emitters are connected in common is connected via a resistor to the collector of the other transistor, and the base of the other transistor is connected via a resistor to the collector of the one transistor. The collectors of the respective transistors are connected via respective resistors to a power supply line. A trigger input signal is applied to the bases of the above-mentioned two transistors via an input circuit comprising two resistors and another pair of transistors. The collectors of the latter pair of transistors are connected to the bases of the other transistors in the same pair. The trigger input signal is applied to respective collectors of the transistors in the latter pair via resistors, respectively, and then applied from the respective emitters of the transistors in the latter pair to the respective bases of the transistors in the former pair, respectively. An output signal is derived from a collector of one of the first-mentioned two transistors and applied to the base of an output transistor via a resistor.

As described above, because many resistors were used in the heretofore known T flip-flop, the conventional flip-flop occupied a large area in a semiconductor integrated circuit. Especially for the purpose of reducing power consumption, the resistances of the respective resistors were designed to be as high as possible. A resistor having a high resistance, however, also occupies a large area. Consequently, such reduction of power consumption limited the amount of reduction of the occupation areas of the respective resistors. Moreover, since a diffused resistor was used in a bipolar integrated circuit for each resistor, the resistance value of the diffused resistor was restricted to a maximum of about 50 KΩ. Hence, there was the shortcoming that current consumption of the entire T flip-flop was not sufficiently reduced. Furthermore, while the T flip-flops in the prior art were triggered in response to a voltage, in many cases the trigger signal to be applied is a current signal. Consequently, the trigger signal was applied after the current signal was converted into a voltage signal. This current-to-voltage conversion was normally performed by a converter which was formed of resistors or formed of transistors and resistors and which was required in addition to the T flip-flop. Therefore, the occupation area of the T flip-flop was further increased. Especially, the resistor in this current-voltage converter required a large resistance value. In this respect also, it was difficult to reduce the occupation area of a T flip-flop in semiconductor integrated circuits.

SUMMARY OF THE INVENTION

It is therefore a principal object of the present invention to provide a flip-flop which has low power consumption and which is adapted to be formed in an integrated circuit.

According to one feature of the present invention, there is provided a flip-flop comprising a first transistor having its emitter connected to a reference potential via a first diode, a second transistor having its emitter connected to the reference potential via a second diode, a third diode connected between the base of the first transistor and the collector of the second transistor, a fourth diode connected between the base of the second transistor and the collector of the first transistor, a third transistor having its emitter connected to a power supply line and its collector connected to the collector of the first transistor, a fourth transistor having its emitter connected to the power supply line, its collector connected to the collector of the second transistor and its base connected in common to the base of the third transistor, a fifth diode connected between the commonly connected emitters and the commonly connected bases of the third and fourth transistors, means for supplying a constant current to the junction between the commonly connected bases of the third and fourth transistors and the fifth diode, means for applying an input signal to the base or bases of the first and/or second transistors, a fifth transistor having its base connected to the emitter of the first transistor and its emitter connected to the reference potential, and means for deriving an output from the collector of the fifth transistor. In a T flip-flop, the means for applying an input signal includes a current mirror having its input end connected to an input terminal and having first and second output ends, a sixth transistor having its collector connected to the first output end of the current mirror, its emitter connected to the base of the first transistor and its base connected to the second output end of the current mirror, and a seventh transistor having its collector connected to the second output end, its emitter connected to the base of the second transistor and its base connected to the first output end.

According to the present invention, since the flip-flop can be formed without employing any resistor, the overall occupation area of the flip-flop can be made small. In addition, since the flip-flop does not consume any power in a resistor, the minimum current required to operate the transistors and diodes will suffice, and in this respect, power consumption can be made extremely low.

Further, since the output is derived, not from the collector of the first (or second) transistor, but through a current mirror consisting of the first diode and the fifth transistor, in this respect also the power consumption and current can be reduced. More particularly, if the output were derived from the collector of the first (or second) transistor, then, in addition to the collector current through a conducting transistor, a current for the output must be supplied from a power supply. In contrast, according to the present invention, the current mirror for producing the output can be driven by the collector current of a conducting transistor, resulting in a reduced current and a reduced power consumption.

Moreover, in the T flip-flop of the present invention, since an input trigger signal is applied through a current mirror in the input means, the input trigger signal can be inputted directly in the form of a current, therefore, there is no need to use a current-voltage converter on the input. Especially, in a semiconductor integrated circuit, it is possible to reduce the occupation area of the flip-flop. A large area reduction is achieved in most case because an input current-voltage converter circuit having resistors with high resistance values is not required.

BRIEF DESCRIPTION OF THE DRAWING

The above and further objects, features and advantages of the present invention will become apparent from the following detailed description of the invention taken in conjunction with the drawing, wherein.

DETAILED DESCRIPTION OF THE INVENTION

Figure 1:
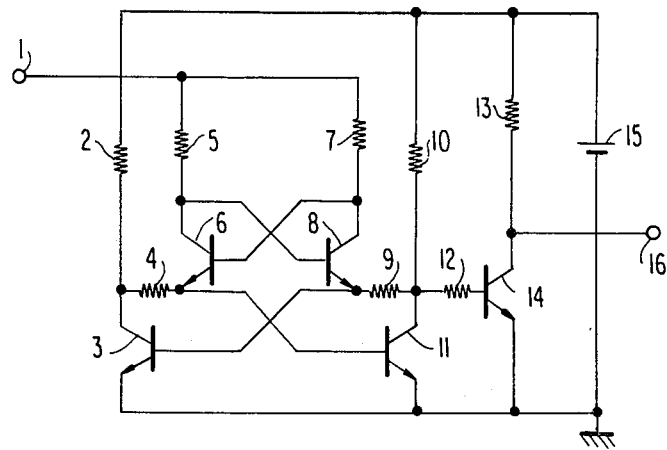
FIG. 1 is a circuit diagram showing a T flip-flop in the prior art.

Referring now to FIG. 1 showing a heretofore known flip-flop, the emitters of transistors 3 and 11 are both grounded. The base of the transistor 3 is connected via a resistor 9 to the collector of the transistor 11 and the base of the transistor 11 is also connected via a resistor 4 to the collector of the transistor 3. The junction between the collector of the transistor 3 and the resistor 4 is connected via a resistor 2 to the positive pole of a power supply 15. Likewise, the junction between the collector of the transistor 11 and the resistor 9 is also connected via a resistor 10 to the positive pole of the power supply 15. An input signal is applied to an input terminal 1, and then it is applied through a resistor 5 to the collector of a transistor 6 and the base of a transistor 8 and also through a resistor 7 to the collector of the transistor 8 and the base of the transistor 6. The emitter of the transistor 6 is connected to the junction between the resistor 4 and the base of the transistor 11, and the emitter of the transistor 8 is connected to the junction between the resistor 9 and the base of the transistor 3. An output is derived from the collector of the transistor 11 and is applied via a resistor 12 to the base of a transistor 14 whose emitter is grounded. The transistor 14 operates as an output buffer stage. The actual output is derived from the collector of the transistor 14 through an output terminal 16. Between the collector of the transistor 14 and the positive pole of the power supply 15 is connected a load resistor 13.

Now the operation of the above-described flip-flop in the prior art will be explained. For convenience of explanation, at first let us assume the operating state where the transistor 3 is ON and the input signal is absent. Under this state, since the transistors 6 and 8 are OFF due to the absence of an input signal, the collector voltage of the conducting transistor 3 is nearly at ground potential. The base potential of the transistor 11 is kept substantially at ground potential to maintain the transistor 11 in an OFF state. Hence, the collector of the transistor 11 takes a high level and supplies a base current to the transistor 3 through the load resistor 10 and the resistor 9, and so, the transistor 3 can hold its ON state. At this moment, since a base current is also supplied to the transistor 14 through the load resistor 10 and the resistor 12, the transistor 14 is turned ON, and the voltage at the output terminal 16 is at a low level. Subsequently, when the input terminal changes to a high level from the above-mentioned state by the application of an input signal, since the emitter of the transistor 6 is nearly at ground potential as described above, the transistor 6 receives a base current through the resistor 7 and turns ON to produce flow of current through the path consisting of the input terminal 1, the resistor 7, the base-emitter path of the transistor 6, the resistor 4, and the collector-emitter path of the transistor 3. At this moment, since the emitter of the transistor 8 is raised with the base-emitter voltage (about 0.7 V) of the transistor 3, it remains off irrespective of the application of input signal. Thus, a current does not flow through the path consisting of the input terminal 1, the resistor 5, the base-emitter path of the transistor 8 and the base-emitter path of the transistor 3. In response to the ON stage of the transistor 6, the collector voltage of the transistor 6 is lowered to become nearly equal to its emitter voltage so that the transistor 8 may be further driven in the OFF direction. If the voltage drop across the resistor 4, caused by the collector-emitter current of the transistor 6, is designed to exceed 0.7 V, then the transistor 11 is turned ON with its collector voltage brought nearly to the ground potential, so the transistor 3 is turned OFF, and thus the state of the flip-flop is inverted. At this moment, the transistor 14 is also turned OFF, and the output terminal 16 takes a high level. Here, it is to be noted that resistor 13 is a load for the transistor 14. Even if the input voltage again takes a low level, only the transistors 6 and 8 are turned OFF, and the states of the transistors 3 and 11 are maintained. Subsequently, when the input voltage again takes a high level, the output state is inverted through an operation that is opposite to the above-described operation.

Here, the power consumption of the illustrated known flip-flop will be calculated, by way of example, with respect to the case where the flip-flop is operated by the power supply 15 having a voltage $V_{cc} = 12$ V. Since the resistance values of the resistors 4, 5, 7, 9 and 12 can be made large, for the purpose of reducing current and the power consumption, the maximum resistance value of 50 KΩ which can be practicably manufactured in an integrated circuit is employed therefor. With regard to the resistors 2, 10 and 13, as the output voltage cannot be made high unless the resistances of these resistors are small as compared to the resistors 4, 9 and 12 and resistors in the next stage corresponding to the resistors 5 and 7, practically about 20 KΩ is the upper limit of the resistance values of these resistors. The current in the assumed case is calculated, on an average, as follows:

$$\frac{V_{cc}}{R_2} + \frac{V_{cc}}{R_{10} + (R_9 // R_{12})} + \frac{1}{2} \cdot \frac{V_{cc}}{R_{13}} = 1.17(mA) \qquad 1)$$

where $R_2$, $R_9$, $R_{10}$, $R_{12}$ and $R_{13}$ represent the resistance values of the resistors 2, 9, 10, 12 and 13. In terms of electric power, the consumption amounts to 14 mW. In the event that a counter employing such T flip-flops in 8 stages is formed in an integrated circuit, the total power consumption is as large as 112 mW, which amounts to about ⅓ the maximum power that can be consumed in an integrated circuit having a high integration density. Therefore, in view of the limitation on the power consumption, it is necessay to lower the overall integration density of the integrated circuit.

More particularly, if the resistors 4, 5, 7, 9 and 12 are formed of diffused resistors of 50 KΩ, each of them requires a chip area of 90,000 μm². If the resistors 2, 10 and 13 are formed of diffused resistors of 20 KΩ, each of them requires a chip area of 36,000 μm². The chip area of each of the transistors 3, 6, 8, 11 and 14 is 10,000 μm². Consequently, taking into account the wirings and others, a total chip area of 610,000 μm² is necessary. If the resistance values of the respective resistors are reduced to reduce the chip area, then the current and the power consumption would become larger. Accordingly, in order to keep the power consumption to a low value, the above-estimated total chip area cannot be reduced very much.

In addition, since the input section including the transistors 6 and 8 and the resistors 5 and 7 respond to a voltage, the input signal applied to the input terminal 1 must be a voltage signal. To that end, because the input signal is normally a current, a current-to-voltage converter circuit is required in the preceding stage of the input terminal 1. For this current-to-voltage conversion are required resistors having large resistance values, and so, a considerably large chip area is required in addition to that needed by the flip-flop.

Figure 2:
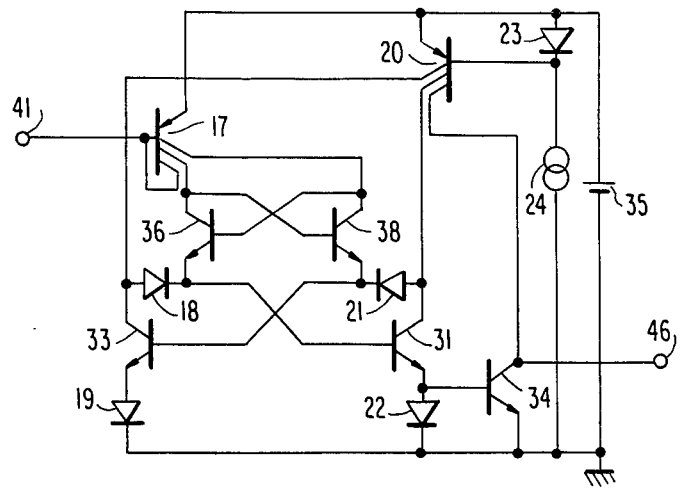
FIG. 2 is a circuit diagram showing one preferred embodiment of the present invention and FIG. 3 is a circuit diagram showing a modification of the preferred embodiment of FIG. 2.
Figure 3:
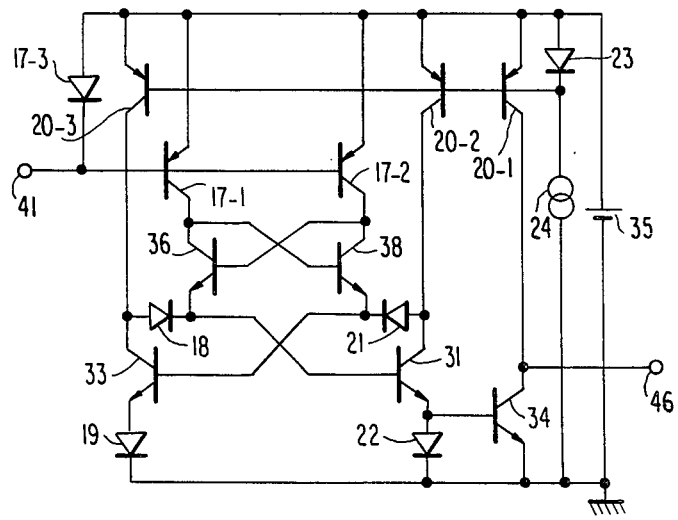

With reference to FIG. 2 showing one preferred embodiment of the present invention, the emitter of a transistor 31 is grounded via a diode 22, and likewise the emitter of a transistor 33 is grounded via a diode 19. The diodes 22 and 19 are connected in such polarity that when the transistor 31 or 33 becomes conducting, a forward current may flow through the corresponding diode 22 or 19, respectively. The collector of the transistor 31 is connected via a diode 21 to the base of the transistor 33, and likewise the collector of the transistor 33 is connected via a diode 18 to the base of the transistor 31. The diodes 18 and 21 are connected in such polarity that when the transistor 31 or 33 becomes conducting, a forward current may flow through the corresponding diode 18 or 21, respectively. The collector of the transistor 31 is connected to one collector of a multi-collector transistor 20, and the collector of the transistor 33 is connected to another collector of the same multi-collector transistor 20. The emitter of the multi-collector transistor 20 is connected to the positive pole of a power supply 35, and between the base and emitter thereof is connected a diode 23 so as to form a current mirror. For the multi-collector transistor 20, normally a lateral transistor having one emitter and a plurality of collectors formed by diffusion in one island region of an epitaxial layer without being overlapped with each other is employed, but alternatively a plurality of transistors 20-1, 20-2 and 20-3 having their emitters and bases, respectively, connected in common could be used therefor as shown in FIG. 3. To the junction between the base of the multi-collector transistor 20 and the diode 23 is connected a constant current source 24. The base-emitter path of a transistor 34 is connected in parallel to the diode 22 to form a current mirror. The collector of the transistor 34 is connected to an output terminal 46 and the remaining collector of the multi-collector transistor 20.

An input terminal 41 is connected to a base of another multi-collector transistor and also to one collector thereof. The emitter of the multi-collector transistor 17 is connected to the positive pole of the power supply 35.

Another collector of the multi-collector transistor 17 is connected to the collector of a transistor 36 and the base of a transistor 38, and still another collector thereof is connected to the collector of the transistor 38 and the base of the transistor 36. Thus, the multi-collector transistor 17 operates as a current mirror circuit. The emitter of the transistor 36 is connected to the junction between the base of the transistor 31 and the diode 18, while the emitter of the transistor 38 is connected to the junction between the base of the transistor 33 and the diode 21. Like the multi-collector transistor 20, the multi-collector transistor 17 also can be formed of a plurality of transistors 17-1 and 17-2 having their bases and emitters, respectively, connected in common, as shown in FIG. 3, instead of being formed of a lateral transistor. It is to be noted that, while the base and one collector of the multi-collector transistor 17 are connected to form a diode, this connection can be neglected by adding, as shown in FIG. 3, a diode 17-3 connected between the emitter and the base with the same polarity as the base-emitter junction of the multi-collector transistor 17.

The operation of the above-described preferred embodiment of the present invention will be explained in the following. For convenience of explanation, let us consider the operation of the circuit when the input signal is absent at the input terminal 41, the multi-collector transistor 17 is OFF and the transistor 33 is ON. Since the transistors 17, 36 and 38 are OFF while the transistor 33 is ON due to the absence of an input signal, the collector voltage of the transistor 33 is nearly equal to the forward voltage (1.7 V) of the diode 19 and has not yet reached a voltage that is high enough to make a base current flow through the transistor 31 via the diode 18. Consequently, the transistor 31 is held OFF. Accordingly, the collector current of one of the collectors of the multi-collector transistor 20, which is the one connected to the collector of the transistor 31, flows into the base of the transistor 33 via the diode 21, and thereby holds the transistor 33 ON. Subsequently, starting from the above-described state, if an input signal is applied to the input terminal 41 and hence the multi-collector transistor 17 changes its state so as to make a base current flow, then currents proportional to this base current flow through the respective collectors of the multi-collector transistor 17. (It is to be noted that the constants of proportion are determined by the proportion of the respective collector areas in the multi-collector transistor 17 and normally they could be chosen at 1:1:1.) Then, the collector current of one of the remaining collectors of the multi-collector transistor 17 begins to flow through the path consisting of the base-emitter path of the transistor 36, the base-emitter path of the transistor 31, and the diode 22. On the other hand, for the collector current of the other of the remaining collectors of the multi-collector transistor 17, one can conceive of the flow path consisting of the base-emitter path of the transistor 38, the base-emitter path of the transistor 33 and the diode 19. However, since the transistor 33 and the diode 19 have been already turned ON, the voltage drop across the base-emitter path of the transistor 33 and the diode 19 in their forward direction is larger than the above-described voltage drop across the base-emitter path of the transistor 31 and the diode 22 in their forward direction when a current begins to flow therethrough, and therefore, a current would hardly flow through the above-mentioned flow path consisting of the base-emitter path of the transistor 38, the base-emitter path of the transistor 33, and the diode 19. Furthermore, as the transistor 36 is turned ON, the base voltage of the transistor 38 is lowered and thus the transistor 38 is more and more driven into the OFF state. Since a base current flows through the transistor 31, the transistor 31 is turned ON, resulting in lowering of its collector voltage, and hence the transistor 33 would be turned OFF. In other words, the state of the flip-flop is inverted. Subsequently, when the input signal disappears, while the transistors 17, 36 and 38 are turned OFF, the state of the flip-flop is not changed. Subsequently, when an input signal is again applied to the input terminal, the state of the flip-flop is again inverted through an operation that is opposite to the above-described operation.

In the illustrated embodiment of the present invention, the information of the ON/OFF state of the transistor 31 is derived as an output from the collector of the transistor 34 by means of a current mirror circuit consisting of the diode 22 and the transistor 34. The collector of the transistor 34 is associated with a constant-current load by making use of the multi-collector transistor 20. However, it is necessary to select the dimension of the relevant collector of the multi-collector transistor 20 or the emitter of the transistor 34 so that, when the transistor 34 is ON, the collector current of the transistor 34 may become larger than the relevant collector current of the multi-collector transistor 20.

The collector currents of the multi-collector transistor 20 are determined by the proportion of the dimensions of the respective collectors, the ratio in dimension between the transistor 20 and the diode 23, and the constant current source 24. For instance, it is possible to select the current of the constant current source 24 at 30 μA, and each collector current of the respective collectors of the multi-collector transistor 20 at 10 μA, and to operate the flip-flop circuit with an overall current consumption of 60 μA. The power consumption is as small as only 0.72 mW for a power supply voltage of $V_{cc}=12$ V, and this power consumption is 1/20 times the power consumption of the flip-flop in the prior art. Moreover, according to the present invention, since the current flowing through the transistor 31 is derived as an output by the intermediary of a current mirror consisting of the diode 22 and the transistor 34, a current for the output, as was required in the prior art, is unnecessary. The currents derived from the respective collectors of the multi-collector transistor 20 could be as large as only the currents required for the collector currents of the transistors 31 and 33, respectively, and in this respect also the current and the power consumption can be reduced as compared to the flip-flop in the prior art.

Moreover, since no resistor requiring a large occupation area is used at all, the flip-flop can be constructed with circuit elements occupying only small areas in a semiconductor integrated circuit. As a diode or a multi-collector transistor can be formed in a chip area of 10,000 μm² like a transistor, as a whole, the flip-flop can be formed with a chip area of 150,000 μm². In other words, as compared to the flip-flop in the prior art illustrated in FIG. 1, only ¼ times the area of the prior art flip-flop is required. Especially, since a trigger input signal can be applied in the form of a current signal to the base of the multi-collector transistor 17, a current-to-voltage converter circuit having resistors of large resistance values is not needed in the preceding stage of the input terminal 41. Thus, in this respect also, the occupation area of the flip-flop can be made small, and so, it can be seen that the flip-flop according to the present invention is especially suitable to be formed in a semiconductor integrated circuit.

In addition, although it is possible that the emitters of the transistors 31 and 33 be grounded without the diodes 19 and 22 and that the base of the output transistor 34 be connected via a diode (not shown) to the collector of the transistor 31, this modification is not favorable with respect to stabilization of the output. More particularly, in this modified circuit construction, when the transistor 33 is ON, a series circuit consisting of the diode 21 and the base-emitter junction of the transistor 33 is connected in parallel to the series circuit consisting of the diode (not shown) and the base-emitter junction of the transistor 34. At this moment, since the transistors 33 and 34 are both saturated, the base currents of these transistors 33 and 34 are determined by the base resistances within the respective transistors. Because these base resistances are easily affected by manufacturing error and hard to control, the base currents of the transistors 33 and 34 would fluctuate greatly. Accordingly, there is the shortcoming that the output from the output transistor 34 is also liable to be influenced by the manufacturing error. In this respect, in the preferred embodiment of the present invention illustrated in FIG. 2, in which a current mirror formed by the diode 22 and the transistor 34 is connected to the emitter of the transistor 31 to derive an output, since the diode 22 would not be saturated, the output from the output transistor 34 is stably derived, irrespective of the manufacturing error.

In FIG. 2, each of the diodes 18 and 21 could be either a plurality of diodes connected in series or a Zener diode. In addition, in the event that the flip-flops shown in FIG. 2 are to be cascaded, since the flip-flop would operate in response to an input trigger current as described above, one of the collectors of the multi-collector transistor 20 feeding a constant current to the collector of the transistor 34 could be omitted, and it is possible to drive the next succeeding stage by connecting directly the collector of the transistor 34 to the input terminal 41 of the following stage.

Furthermore, in the event that the present invention is applied to a flip-flop other than the T flip-flop, the input section consisting of the multi-collector transistor 17 and the transistors 36 and 38 could be replaced by an input section having any other appropriate circuit construction, or else an input signal could be directly applied to the base of one of the transistors 31 and 33.

I claim:

1. A flip-flop comprising a first transistor having its emitter coupled to a reference potential via a first diode; a second transistor having its emitter coupled to said reference potential via a second diode; a third diode connected between the base of said first transistor and the collector of said second transistor; a fourth diode connected between the base of said second transistor and the collector of said first transistor; a third transistor having its emitter coupled to a power supply line and its collector coupled with the collector of said first transistor; a fourth transistor having its emitter connected to the emitter of said third transistor, its collector coupled with the collector of said second transistor and its base connected to the base of said third transistor; a fifth diode connected between the commonly connected emitters and the commonly connected bases of said third and fourth transistors; means for supplying a constant current to the junction between the commonly connected bases of said third and fourth transistors and said fifth diode; means for applying an input signal to the bases of either or both of said first and second transistors; a fifth transistor having its base coupled with the emitter of said first transistor and its emitter coupled with said reference potential; and means for deriving an output from the collector of said fifth transistor.

2. A flip-flop as claimed in claim 1, wherein said third and fourth transistors and said fifth diode form a first current mirror circuit, and said fifth transistor and said first diode form a second circuit mirror circuit.

3. A flip-flop as claimed in claim 2, wherein said first, second, third, fourth, and fifth transistors and said first, second, third, fourth, and fifth diodes are formed in a single semiconductor chip.

4. A flip-flop as claimed in claim 3, wherein said third and fourth transistors are formed in a multi-collector transistor having its base operating as the bases of said third and fourth transistors, its emitter as the emitters of said third and fourth transistors, its first collector as the collector of said third transistor, and its second collector as the collector of said fourth transistor.

5. A flip-flop as claimed in claim 1, wherein said output deriving means includes an output terminal and a sixth transistor having its collector coupled with the collector of said fifth transistor and said output terminal, its emitter coupled with the emitters of said third and fourth transistors and its base coupled with the bases of said third and fourth transistors.

6. A flip-flop as claimed in claim 5, wherein said third, fourth, and sixth transistors and said fifth diode form a first current mirror circuit, and said fifth transistor and said first diode form a second current mirror circuit.

7. A flip-flop as claimed in claim 6, wherein said first, second, third, fourth, fifth and sixth transistors and said first, second, third, fourth and fifth diodes are formed in a single semiconductor chip.

8. A flip-flop as claimed in claim 7, wherein said third, fourth and sixth transistors are formed in a multi-collector transistor having its base operating as the bases of said third, fourth and sixth transistors, its emitter as the emitters of said third, fourth and sixth transistors, its first collector as the collector of said third transistor, its second collector as the collector of said fourth transistor and its third collector as the collector of said sixth transistor.

9. A flip-flop circuit as claimed in claim 6, 7 or 8, wherein said means for applying an input signal includes a third current mirror circuit having its input end connected to an input terminal and having first and second output ends, a seventh transistor having its collector coupled with said first output end, its emitter coupled with the base of said first transistor and its base coupled with said second output end, and an eighth transistor having its collector coupled with said second output end, its emitter coupled with the base of said second transistor and its base coupled with said first output end.

10. A flip-flop as claimed in claim 9, wherein said third current mirror circuit includes a ninth and a tenth transistor having their emitters coupled in common with said power supply line and their bases coupled in common with said input terminal and a sixth diode connected between their emitters and their bases, the collector of said ninth transistor being coupled to said first output end, and the collector of said tenth transistor being coupled to said second output end.

11. A flip-flop as claimed in claim 10, wherein said ninth and tenth transistors and said sixth diode are formed in a second multi-collector transistor having its base operating as the bases of said ninth and tenth transistors, its emitter as the emitters of said ninth and tenth transistors, its first collector as the collector of said ninth transistor, its second collector as the collector of said tenth transistor and its third collector, said third collector being connected to said base of said multi-collector transistor thereby forming said sixth diode in equivalent.

12. A flip-flop comprising first and second transistors of a first polarity and adapted to receive an input signal at their bases and having their emitters connected to one end of a power supply, a diode connected between said bases and said emitters of said first and second transistors, a third transistor of a second polarity having its collector connected to the collector of said first transistor and its base connected to the collector of said second transistor, a fourth transistor of said second polarity having its collector connected to the collector of said second transistor and its base connected to the collector of said first transistor, fifth and sixth transistors of said second polarity having their bases connected to the emitters of said third and fourth transistors, respectively, a first circuit including at least one diode element connected between the collector of said fifth transistor and the base of said sixth transistor, a second circuit including at least one diode element connected between the collector of said sixth transistor and the base of said fifth transistor, and first and second constant-current circuits connected to the respective collectors of said fifth and sixth transistors, respectively.

13. A flip-flop as claimed in claim 12, further comprising a current mirror circuit having its input end coupled with the emitter of said fifth transistor and its output end coupled with an output terminal.

14. A flip-flop as claimed in claim 13, wherein said current mirror circuit includes a second diode connected between the emitter of said fifth transistor and a reference potential line, and a seventh transistor having its base connected to the emitter of said fifth transistor, its emitter connected to said reference potential line and its collector coupled with said output terminal.

15. A flip-flop as claimed in claim 14, further comprising a third diode connected between the emitter of said sixth transistor and said reference potential line.

16. A flip-flop circuit comprising a first transistor having its emitter connected to a reference potential via a first diode, a second transistor having its emitter connected to said reference potential via a second diode, first means for connecting the base of said first transistor to the collector of said second transistor, second means for connecting the base of said second transistor to the collector of said first transistor, a first load for connecting the collector of said first transistor to a power supply line, a second load for connecting the collector of said second transistor to said power supply line, means for applying an input signal to the base or bases of said first and/or second transistors, a third transistor having its base-emitter path connected in parallel to said first diode, and means for deriving an output from the collector of said third transistor.

17. A flip-flop circuit as claimed in claim 16, wherein said first and second connecting means include at least one semiconductor PN junction, respectively, and said first and second loads are constant current sources.

18. A flip-flop circuit as claimed in claim 17, wherein each of said semiconductor PN junctions is that of a semiconductor diode.

19. A flip-flop circuit as claimed in claim 16, wherein said input signal applying means includes an input terminal, a current mirror having an input end coupled with said input terminal and first and second output ends, a fourth transistor having a collector connected to said first output end, a base to said second output end and an emitter to the base of said first transistor, and a fifth transistor having a collector connected to said second outpput end, a base to said first output end and an emitter to the base of said second transistor.

* * * * *

UNITED STATES PATENT AND TRADEMARK OFFICE
CERTIFICATE OF CORRECTION

PATENT NO. : 4,472,646
DATED : September 18, 1984
INVENTOR(S) : Sugawara

It is certified that error appears in the above-identified patent and that said Letters Patent is hereby corrected as shown below:

Column 3, line 10, "case" should be --cases--.

Column 5, line 57, after "therefor", insert a --,--;

line 66, after "transistor", insert --17--.

Column 9, line 11, "circuit" (first occurrence) should be --current--.

Column 10, line 24, delete "element";

line 27, delete "element".

Column 12, line 4, "outpput" should be --output--.

Signed and Sealed this

Thirtieth Day of April 1985

[SEAL]

Attest:

DONALD J. QUIGG

Attesting Officer     Acting Commissioner of Patents and Trademarks